United States Patent [19]
Day et al.

[11] Patent Number: 5,439,779
[45] Date of Patent: Aug. 8, 1995

[54] AQUEOUS SOLDERMASK

[75] Inventors: Richard A. Day, Whitney Point, N.Y.; Donald H. Glatzel, New Milford, Pa.; David J. Russell, Apalachin, N.Y.; Jeffrey D. Gelorme, Painville, Conn.; John R. Mertz, Endicott, N.Y.

[73] Assignee: International Business Machines Corporation, Armonk, N.Y.

[21] Appl. No.: 259,355

[22] Filed: Jun. 13, 1994

Related U.S. Application Data

[63] Continuation of Ser. No. 20,661, Feb. 22, 1993, abandoned.

[51] Int. Cl.⁶ .............................................. G03C 1/725
[52] U.S. Cl. ...................................... 430/280; 522/31; 522/86; 522/166; 522/170
[58] Field of Search ................... 430/280; 522/31, 166, 522/86, 170

[56] References Cited

U.S. PATENT DOCUMENTS

| | | | |
|---|---|---|---|
| 3,794,576 | 2/1974 | Watt | 430/280 |
| 3,817,906 | 6/1974 | Tsukiok . | |
| 3,936,557 | 2/1976 | Watt | 522/166 |
| 4,058,401 | 11/1977 | Crivello | 96/115 |
| 4,069,054 | 1/1978 | Smith | 252/426 |
| 4,069,055 | 1/1978 | Crivello | 96/115 |
| 4,081,276 | 3/1978 | Crivello | 96/35.1 |
| 4,138,255 | 2/1979 | Crivello | 430/280 |
| 4,175,963 | 11/1979 | Crivello | 430/296 |
| 4,246,147 | 1/1981 | Bakos et al. | 523/455 |
| 4,250,053 | 2/1981 | Smith | 252/426 |
| 4,279,985 | 7/1981 | Nonogaki et al. | 430/280 |
| 4,351,708 | 9/1982 | Berner et al. | 204/159.23 |
| 4,442,197 | 4/1984 | Crivello et al. | 430/280 |
| 4,544,623 | 10/1985 | Audykowski et al. | 430/280 |
| 4,546,067 | 10/1985 | Irving et al. | 430/325 |
| 4,548,890 | 10/1985 | Dickinson et al. | 430/280 |
| 4,548,895 | 10/1985 | Irving et al. | 430/325 |
| 4,624,912 | 11/1986 | Zweifel et al. | 430/258 |
| 4,659,649 | 4/1987 | Dickinson et al. | 430/280 |
| 4,684,671 | 8/1987 | Tsuchiya et al. | 522/31 |
| 4,693,961 | 9/1987 | Bauer | 430/325 |
| 4,735,891 | 4/1988 | Budde et al. | 430/313 |
| 4,868,059 | 9/1989 | Walker et al. | 428/416 |
| 4,940,651 | 7/1990 | Brown et al. | 430/280 |
| 4,943,516 | 7/1990 | Kamayachi et al. | 522/166 |
| 5,026,624 | 6/1992 | Day et al. | 430/280 |

OTHER PUBLICATIONS

*Hi-Tek Polymers*, Sep. 1988, product bulletin regarding CMD WJ55-3540 Epoxy Resin.
*Hi-Tek Polymers*, Feb. 1988, product bulletin regarding CMD W55-5003 Epoxy Dispersion.
*Hi-Tek Polymers*, Oct. 1988, product bulletin regarding CMD W60-3515 Epoxy Resin Dispersion.

*Primary Examiner*—Mark A. Chapman
*Attorney, Agent, or Firm*—Calfee Halter & Griswold

[57] ABSTRACT

The present invention provides a photoimageable soldermask that may be applied using aqueous solvents, thereby reducing the emission of organic solvents. The soldermask contains an epoxy based resin system comprised of at least one epoxy resin, a coating agent, and preferably a cationic photoinitiator and a dye.

4 Claims, No Drawings

AQUEOUS SOLDERMASK

This is a continuation of application Ser. No. 08/020,661 filed on Feb. 22, 1993, now abandoned.

BACKGROUND OF THE INVENTION

Conventional photoimageable soldermasks, which may be applied in liquid form, typically contain 30–80% solids in solvents, such as naphtha, propylene glycol monomethyl ether, diglyme, and/or propylene glycol monomethyl ether acetate. These soldermasks require organic solvents to apply the mask to a substrate such as a circuit board or circuit board precursor and develop the masks. Some of the organic solvent evaporates and is lost to the environment. Of the total solvent lost to the environment, 85–95% of the solvent, is typically lost during the application process and 5–15% of the solvent is lost during the developing steps.

Recently, soldermasks have been devised that are designated "aqueous soldermasks". While they are developed using aqueous solvents, they are nevertheless applied using organic solvents. The use of such aqueous soldermasks reduces the solvent loss by only 5–15%. In contrast, a soldermask that is applied using an aqueous solvent, even though developed using an organic solvent, would reduce the overall organic solvent emissions by 85–95%.

It is desirable to have a soldermask that is applied using an aqueous solvent so as to reduce the emission of organic solvents during the application process.

SUMMARY OF THE INVENTION

The present invention provides a photoimageable soldermask that may be applied using aqueous solvents, thereby reducing the emission of organic solvents. The soldermask contains an epoxy based resin system comprised of at least one epoxy resin, a coating agent, a cationic photoinitiator and preferably a dye.

DETAILED DESCRIPTION OF THE INVENTION

The present invention provides a photoimageable soldermask that may be applied using an aqueous solvent rather than organic solvents, thereby reducing the emission of organic solvents. The soldermask contains an epoxy based resin system comprised of at least one aqueously dispersed epoxy resin, a coating agent, a cationic photoinitiator, and preferably a dye. As used herein, the term "solvent" encompasses materials which may not be solvating the soldermask components but functioning as a carrier.

The Epoxy Resin

In formulating a soldermask there are many competing factors that must be considered in order to provide a desired end product. The composition must be photoimageable, and when cured, adhere to the substrate, and withstand temperatures above 300° C. The composition when coated on the substrate must dry to a tack free film.

In general, the epoxy resin system contains at least one aqueously dispersed resin. The resin system is characterized by preferrably having an absorbance of light in a 330 to 770 nm region of less than 0.1 for a 2 mil thick film. One resin is a polyepoxy novolak resin having a molecular weight of from about 200 to about 10,000, and a weight per epoxide of about 200 to 400. A suitable polyepoxy is available under the tradename "RDX-84853" from High Tek Polymers now a division of Rhone-Poulenc, and is an aqueous dispersion of Epirez SU-6 resin sold by High Tech Polymers. The 84853 has about 40–60% solids in water, and a weight per epoxide of about 226–231.

However, since flame retardancy is desirable for many applications, and the polyepoxy resin does not exhibit adequate flame retardancy, a second resin is added to provide flame retardancy and impart photoactivity. This second resin is an aqueous dispersion of a brominated epoxy resin such as, for example, a low molecular weight, high softening point, glycidyl ether of brominated bisphenol A having weight per epoxide of 200 to 500, and a molecular weight from 200 to about 10,000, preferably about 1,000 to 1,700. A suitable resin of this type is an epoxidized diglycidyl ether of a bromonated bisphenol A, containing 48% bromine, with a weight per epoxide of about 320–329, a melting point of about 97° C., having about 52–55% solids in water, sold by High Tek Polymers Corporation, under the Trade Mark "RDX-80206".

The two epoxy resins described above, selected to be within certain molecular weight ranges, are blended in certain percentages. It has been found generally that from about 10% to about 90%, preferably about 30% to about 70%, more preferably 50% of the polyepoxy novolak resin is desired. About 10% to about 90%, more preferably about 30% to about 70% and most preferably about 50% of the epoxidized brominated bisphenol A is present.

Optionally another resin, an aqueous dispersion of a solid (at room temperature) difunctional bisphenol A epoxy resin having a weight per epoxide of about 500 to 50,000 and a molecular weight of about 1,000 to 100,000 may be added. A suitable resin of this type is sold by Rhone-Poulenc, under the Trade Mark "CMD WJ 55-3540". The 3540 is a diglycydlether of bisphenol A, having a weight per epoxide of about 1,800, and about 55% solids in an aqueous solvent which solvent contains about 76% water and 24% 2-propoxyethanol.

It has been found generally that from about 10% to about 90%, preferably about 20% to about 80%, more preferably 36% of the high molecular weight resin is desired. This resin will provide the basis of the necessary rheological and physical properties necessary for coating and for soldermask applications.

Other suitable resins which may be added include a polyfunctional aromatic epoxy resin containing about 55% solids in water, with an average functionality of 3, and having a weight per epoxide of about 205, available under the tradename "CMD W55-5003" from High Tek Polymers; and a bisphenol A epoxy resin having an epoxide equivalent weight of about 220 to 260, containing about 63% solids in water, available under the tradename "CMD W60-3515" from High Tek Polymers

The Coating Agent

The addition of the coating agent, preferably a surfactant, results in a soldermask that displays good coating properties. Suitable coating agents include surfactants such as fluorinated polyether surfactants such as, for example, FC 430 available from 3M Company.

The Cationic Photoinitiator

While a soldermask can be made which lacks a photoinitiator, the soldermask cannot be photoimaged. Suitable photoinitiators are known in the art and include, for example a triarylsulfonium salt available under the tradename "UVE 1014" from General Electric or under the tradename "Cyracure UVI 6974" from Union Carbide. The photoinitiator may be added from 1 to about 15 parts per hundred (pph), preferably about 5 pph, of the combined resin weight.

Optional Ingredients

Optional materials such as dyes, thixotropes, photosensitizers and other surfactants may be added to the soldermask.

Water or water based solvents may be added to adjust the viscosity of the soldermask prior to application as desired.

EXAMPLE 1

First 69.5 g. of the RDX 85843 resin, 71.9 g. of the RDX 80206 resin, 65.3 g. CMD WJ55 3540 resin from High Tek Polymers and 0.4 g. of a fluorinated polyether surfactant, available under the tradename "FC 430" from 3M Company were combined and mixed to provide an epoxy resin mixture having, on the average, solids of about 52.2%.

Next, 10.1 g. of UVE 1014 solution was added to 200 g of the epoxy resin mixture, to provide a solution having an average solids of about 52.2%. Films of soldermasks were prepared using a number 75 wound wire rod, air dried for 20 minutes, and then baked at about 110° C. for 10 minutes. The films dried to a tack-free coating. Sample films were exposed through a Stauffer 21 step wedge and a standard photo tool, an Air Force target, then baked at 120° C. for about 12 minutes. The samples were then developed in gamma-butyrolactone. The results are shown in Table I.

Films of soldermask were made using a #75 rod to obtain a coating of 1.5–1.8 mil thickness, and baked at varying temperatures. First the panel was dried horizontally at 22° C. for 12 minutes, then dried at 40° C. for 12 minutes, and then turned and dried vertically at 110° C. for 26 minutes. The coatings were smooth in appearance after the both the initial air drying and after the 40° C. oven dry. Following the 26 minutes at 110° C., the surface of the coatings had dimples, and such drying method is less preferred. The coatings were tack-free to touch and had a pencil hardness of B. There were no signs of flow or sagging.

EXAMPLE 2

Ethyl violet dye was added to 0.075 parts by weight to the material of example 1. Five films of soldermask were prepared as described above. Samples #1, 2, 3 & 5 were air dried for 2 hours, then oven dried at 150° C. for 8 minutes. Sample #4 was baked at 130° C. for 12 minutes. The resulting films were tack free and had few coating defects.

Samples 1 through 5 were exposed to different exposure doses of UV light through the Stauffer 21 step wedge and the Air Force target and then baked at 120° C. for about 12 minutes and developed for 90 seconds using a spray developer with butyrolactone as the solvent. The soldermask samples were then subjected to a U.V. cure at 2000 mJ and an oven cure at 150° C. for 60 minutes. The results are shown in Table I.

Sample 4 was subjected to solder shock test in which the coating was exposed to 260° C. solder for about 20 seconds. Each of the specimens performed satisfactorily.

TABLE I

| | Exposure Dose (mJ) | | | | | | | | | | | | | | |
|---|---|---|---|---|---|---|---|---|---|---|---|---|---|---|---|
| | 800 | | | 900 | | | 1000 | | | 1100 | | | 1200 | | |
| EX | step[1] held | target | Mil | step held | target | Mil | step held | target | Mil | step held | target | Mil | step held | target | Mil |
| 1 | 4 | 1.5 | (6.2) | 5 | 2.3 | (3.9) | 5 | 3.1 | (2.5) | 5 | 3.2 | (2.2) | 6 | 3.4 | (1.7) |
| 2A | 3 | 1.5 | (6.2) | 3 | 2.2 | (4.4) | 3.2 | 2.2 | (4.4) | 4 | 2.4 | (3.5) | 4.2 | 4.3 | (1.0) |
| 2B | 2 | 2.5 | (3.2) | 3 | 2.5 | (3.2) | 3 | 3.1 | (2.5) | 3.5 | 3.3 | (2.0) | 4 | 3.4 | (1.7) |

EXAMPLE 3

First, 50 g. of the RDX-80206 resin, 50 g. of the RDX-84853 resin, 0.14 g FC 430 and 5.0 g of UVE 1014 were mixed as above. A film was made by the draw down technique using tape and a glass rod. The film was air dried and then oven dried for an additional 10 minutes at 110° C. The resulting product exhibited suitable coating properties. The film was imaged, developed and cured as above and the results are shown in Table II.

EXAMPLE 4

First 25 g. of the RDX-84853 resin was combined with 0.04 g of the surfactant FC 430 and 1.5 g UVE 1014 and mixed as above. A film was made by the draw down technique using tape and a glass rod. The film was air dried and then oven dried for an additional 10 minutes at 110° C. The resulting product exhibited suitable coating properties. The film was imaged, developed and cured as above and is shown in Table II.

A sample of the material was also subjected to solder shock tests as in the above examples; the soldermask passed the solder shock test.

TABLE II

| | Exposure Dose (mJ) | | | | | | | | |
|---|---|---|---|---|---|---|---|---|---|
| | 800 | | | 1000 | | | 1200 | | |
| Panel# | Wedge | Target | Mils | Wedge | Target | Mils | Wedge | Target | Mils |
| Ex. 3 | 4.4 | 4.4 | (0.9) | 5.1 | 4.2 | (1.1) | 6.1 | 3.4 | (1.7) |
| Ex. 4 | 5.0 | 4.4 | (0.9) | 5.5 | 3.6 | (1.4) | 6.1 | 3.3 | (2.0) |
| Ex. 3A | 4.0 | 4.6 | (0.7) | 4.1 | 5.2 | (0.6) | 5.0 | 4.3 | (1.0) |
| Ex. 3B | 3.5 | 4.4 | (0.9) | 4.5 | 4.4 | (0.9) | 5.1 | 3.6 | (1.4) |

The formulations of the present invention reduce the organic solvent emission to the environment by 85–95% over conventional soldermasks. These formulations are not limited to the resins disclosed herein which may be varied in the resin ratio or substitutions made to their processing or any properties.

While the invention has been described as a soldermask, it may also be used for other purposes such as photoimageable dielectric, an etch resist, a permanent additive resist, and a protective coating.

We claim that:

1. A cationically polymerizable composition for forming a soldermask comprising:
   a. an aqueously dispersed photosensitive cationically polymerizable epoxy based resin system comprising:
      from about 10% to about 90% an aqueous dispersion of a polyepoxy novolak resin having a molecular weight of between about 200 and 10,000, a weight per epoxide of from about 200 to about 400, and essentially free of organic solvents; and
      from an effective amount to about 90%, by weight, of an aqueous dispersion of a glycidyl ether of brominated Bisphenol A having a molecular from about 200 to about 10,000 a weight per epoxide of from about 200 to 500;
   b. from about 0.1 to about 15 parts by weight of a cationic photoinitiator capable of initiating polymerization in said epoxidized resin system upon exposure to actinic radiation; and,
   c. surfactant; wherein the composition is essentially free of organic solvents, and the composition when cured, is a solder mask that can withstand solder temperatures of 260° C.

2. The cationically polymerizable composition as defined in claim 1, further comprising from an effective amount to about 80%, of an aqueous dispersion of a solid, difunctional bisphenol A epoxy resin having a molecular weight of between about 1,000 to about 100,000.

3. The cationically polymerizable composition as defined in claim 2, wherein the composition contains about 33% polyepoxy novolak resin; about 33% of the brominated epoxy resin; and about 33 % the aqueous dispersion of the solid, difunctional bisphenol A epoxy resin; and about 5 parts by weight of sulfonium salt photoinitiator.

4. The cationically polymerizable composition as defined in claim 1, wherein there is about 50% polyepoxy resin; about 50% of the brominated epoxy resin; about 5 parts by weight of the sulfonium salt photoinitiator.

* * * * *